United States Patent [19]

Michaelis et al.

[11] Patent Number: 5,036,241
[45] Date of Patent: Jul. 30, 1991

[54] PIEZOELECTRIC LAMINATE AND METHOD OF MANUFACTURE

[75] Inventors: A. John Michaelis, Glen Ellyn, Ill.; A. David Paton, Cambridge, England

[73] Assignee: XAAR Ltd., Cambridge, England

[21] Appl. No.: 306,736

[22] Filed: Feb. 3, 1989

[30] Foreign Application Priority Data

Feb. 4, 1988 [GB] United Kingdom ............... 8802506

[51] Int. Cl.$^5$ ............................................ H01L 41/08
[52] U.S. Cl. .................................... 310/358; 310/363; 310/364; 310/311
[58] Field of Search ............... 310/311, 800, 357–359, 310/363, 364; 29/25.35; 361/233; 264/23, 24

[56] References Cited

U.S. PATENT DOCUMENTS

| | | | |
|---|---|---|---|
| 2,956,184 | 10/1960 | Pollack | 310/358 X |
| 3,213,027 | 10/1965 | Fatuzzo et al. | 310/357 X |
| 3,240,962 | 3/1966 | White | 310/357 |
| 3,912,830 | 10/1975 | Murayama et al. | 310/800 X |
| 4,109,359 | 8/1978 | Cross et al. | 29/25.35 |
| 4,375,042 | 2/1983 | Marcus | 310/357 |
| 4,533,849 | 8/1985 | Schnell | 310/358 X |
| 4,608,509 | 8/1986 | Yamamoto et al. | 310/357 |

FOREIGN PATENT DOCUMENTS

| | | |
|---|---|---|
| 1055756 | 2/1954 | France . |
| 1096783 | 12/1967 | United Kingdom . |
| 2161647 | 1/1986 | United Kingdom . |

Primary Examiner—Mark O. Budd

[57] ABSTRACT

A piezoelectric laminate comprises a piezoelectric layer and an insulating substrate layer rigidly bonded thereto. During poling, conditions are established under which a poling potential is established at the boundary of the layers which insures that a substantial part of the poling voltage is dropped across the piezoelectric layer. The poling voltage is maintained for a period greater than the time constant under the poling conditions of the material to which the poling voltage is applied. In one embodiment, the poling conditions are achieved by substantially enhancing the conductivity of the substrate layer relative to that of the piezoelectric layer. In a second embodiment, an intermediate bond layer is selectively switched from a non-conductive to a conductive state in response to a selected stimulus so as to form an electrode for facilitating the application of a poling field directly across the piezoelectric layer.

5 Claims, 3 Drawing Sheets

PIEZOELECTRIC LAMINATE AND METHOD OF MANUFACTURE

BACKGROUND OF THE INVENTION

The present invention generally relates to piezoelectric laminates and their manufacture, and in particular concerns a method of manufacturing a piezoelectric laminate in which the piezoelectric layer may be poled after it has been bonded to a rigid substrate layer.

Piezoelectric laminates typically comprise a layer of piezoelectric material bonded to a rigid insulating substrate material by an insulating elastically stiff or rigid bond layer. Such laminates are widely used in the manufacture of piezoelectric transducer arrays. Typical applications include the formation of phased array ultrasonic transducers and as components of ink jet printheads.

The bond layer, which normally has a rigidity comparable with that of the piezoelectric material or of the ceramic or glass substrate, generally has to be formed at an elevated temperature above or possibly just below the Curie temperature of the piezoelectric material. If exposed to these temperatures, the piezoelectric material may lose or have its remnant polarization substantially reduced. As a consequence, the piezoelectric material cannot be effectively pre-poled before forming the bond layer. Poling therefore preferably takes place subsequent to the formation of the bond layer.

Conventionally, the assembled piezoelectric laminate is poled by establishing a poling field between a pair of metal electrodes applied to the opposite faces of the laminate. This poling configuration has heretofore required the establishment of an impractically large poling field to effect adequate poling in a reasonable time period. That is, because of the high dielectric constant of the piezoelectric material relative to that of the substrate, a relatively small portion of the poling field is applied across the piezoelectric layer. Consequently, the strength of the poling field must be increased by a relatively large factor to effect poling, but frequently the extent of increase required is simply impractical.

OBJECTS OF THE INVENTION

It is therefore a basic object of the present invention to provide an improved piezoelectric laminate and its method of manufacture.

It is a further object of the invention to provide an improved method for forming a piezoelectric laminate in which the piezoelectric material may be poled after the laminate has been formed.

It is yet another object of the invention to provide an improved method for forming a piezoelectric laminate in which the piezoelectric material may be poled after the laminate has been formed, the poling operation taking place using practical poling fields.

As explained in further detail hereinafter, these and other objects and advantages are achieved according to the invention by establishing conditions under which a poling potential is created at the boundary of the piezoelectric and substrate layers of a piezoelectric laminate which insures that a substantial part of the poling voltage is dropped across the piezoelectric layer and by applying the poling voltage for a period greater than the time constant under the poling conditions of the material to which the poling voltage is applied.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENTS

Figure 1A:
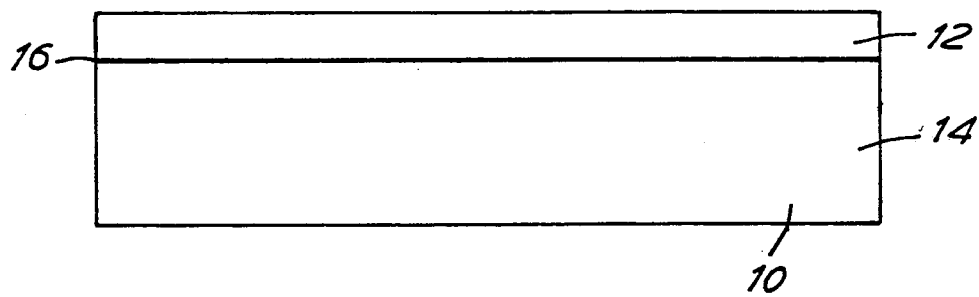
FIGS. 1(a) and 1(b) illustrate two forms of piezoelectric laminates which may be fabricated according to one embodiment of the present invention.

FIG. 1(a) illustrates one form of a laminated ceramic component 10, comprising on one face a sheet or layer of piezoelectric material 12 and on the other face a sheet or layer of rigid insulating material 14. The two layers 12 and 14 of component 10 are bonded together by a suitable bond layer 16. The illustrated component may be subjected to further manufacturing processes for eventual use as an ultrasonic phased array transducer or as an ink jet array printhead component. The present invention is concerned with the manufacture and poling of the laminate component 10.

In a preferred form of the invention, the piezoelectric material 12 comprises a sheet of lead zirconium titanate (PZT) piezoelectric ceramic, but it will be understood that other piezoelectric ceramic or crystalline materials which become piezoelectric as the result of poling by application of an electric poling field can be employed within the scope of the invention. Also, the rigid insulating sheet 14 preferably comprises a sheet of glass or ceramic (or glass-ceramic) but other insulating materials may similarly be used.

Preferably, the values of the elastic modulus and density of the insulating sheet 14 are chosen so that its acoustic impedance has a specified value relative to that of the piezoelectric material 12 to obtain a defined acoustic performance. Alternatively, the elastic modulus of sheet 14 may be chosen to be equal to or greater than that of the piezoelectric material 12 to stiffen the substrate against low frequency deformation of the parts of a piezoelectric array transducer. The thermal expansion coefficient of the insulating sheet 14 should at the same time be chosen to closely match that of the piezoelectric material 12. This choice provides a laminate component 10 which is thermally matched for use over a practical operating range (typically $-20$ to $+100$ degrees centigrade) so that during manufacture and operation the bond layer is not subjected to significant thermal stress which could deleteriously affect the integrity of the laminate. Laminate component 10 will also have little or no tendency to bend under thermal variations. The dielectric constant of the insulating sheet 14 is also preferably chosen to be substantially less than that of the piezoelectric sheet 12 (e.g. 10–100 times less) so that operating electric fields in the piezoelectric layer 12 are suitably confined thereto to prevent deleterious electrical crosstalk between multiple components 10 in a transducer array.

The bond layer 16 between the piezoelectric sheet 12 and the insulating sheet 14 may take a number of forms depending on the manufacturing process. In one case the bond layer 16 may comprise a ceramic-ceramic bond which results from the co-firing of the two ceramic sheets in a furnace during manufacture. The bond layer 16 may also comprise a PZT-glass bond in the case that the piezoelectric layer 12 is thermally bonded to a glass or glass-ceramic sheet or may comprise a thin glass sheet bond for fusing the PZT and ceramic sheets 12 and 14 together at a temperature suitably above or immediately below the Curie temperature of the PZT ceramic 12. In each case the bond layer 16 should satisfy the same design requirements as the insulating sheet 14 in regard to its elastic modulus and density in the operating range, to provide appropriate acoustic impedance or stiffness, and should also possess bond strength values, having regard to thermal, manufacturing and operating stresses adequate for component integrity during its service life.

Figure 1B:
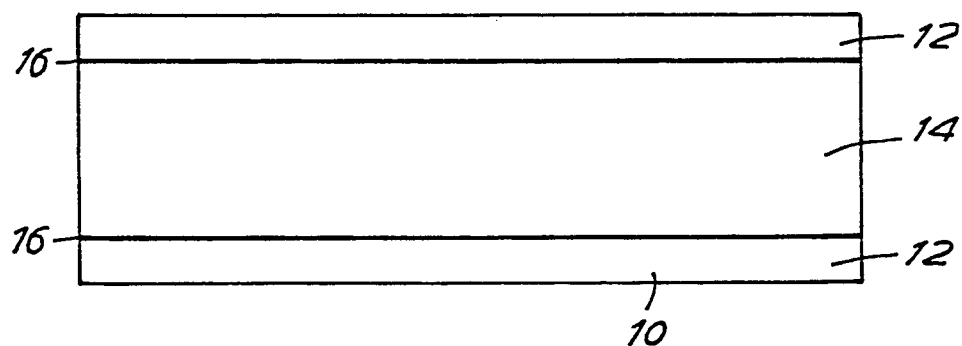

The laminated ceramic component 10 may take other forms than that illustrated in FIG. 1(a). For example, a laminate component 10 is illustrated in FIG. 1(b) comprising three layers. In this embodiment, a piezoelectric sheet 12 is bonded to each of the opposing faces of an insulating sheet 14 by respective bond layers 16.

As previously described, when the bond layer 16 is formed above the Curie temperature of the piezoelectric sheet 12, or is formed at a temperature immediately below its Curie temperature, the remnant polarization of the piezoelectric sheet may be lost or reduced substantially. A technique for poling or for maintaining the state of polarization of the piezoelectric material 12 after forming the bond must therefore be provided.

Figure 3:
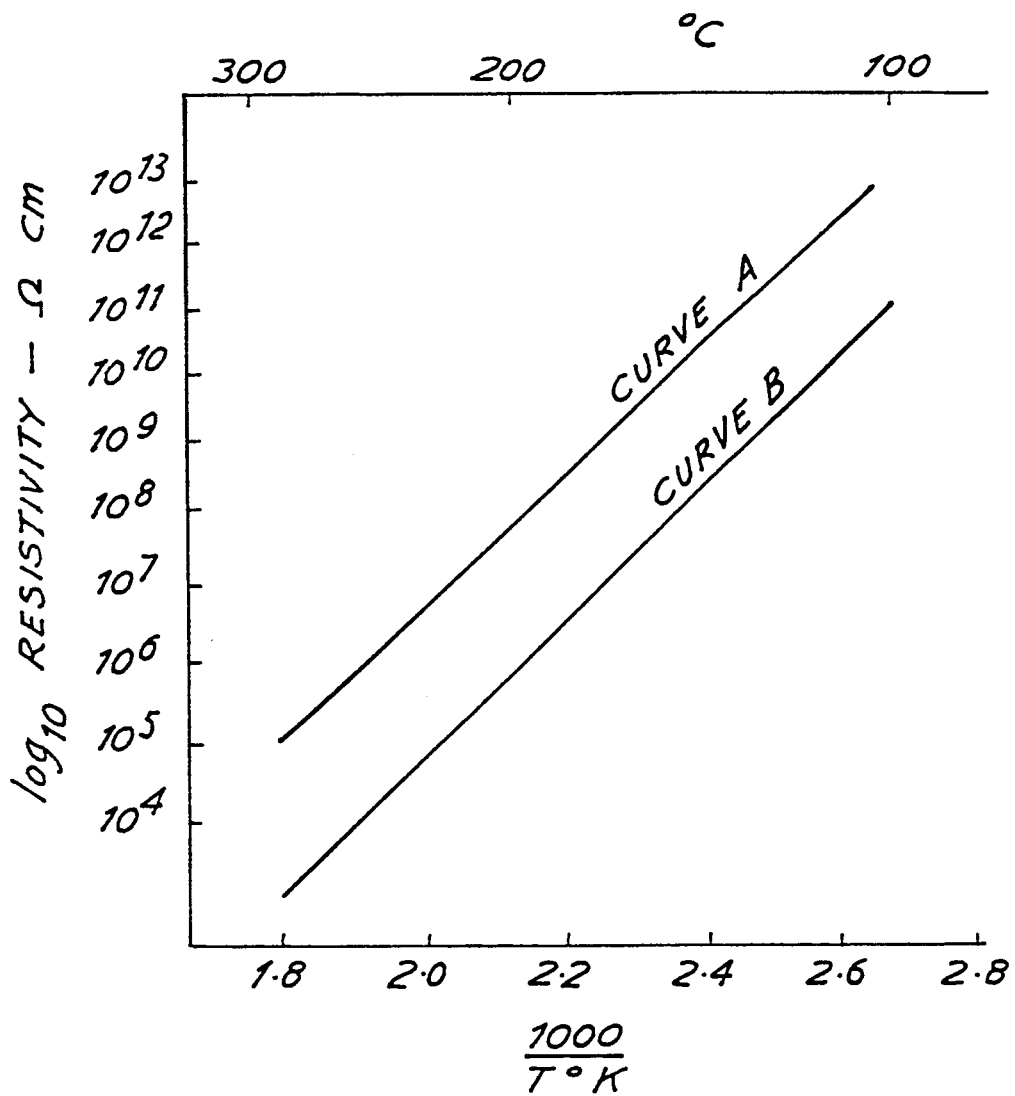
FIG. 3 graphically illustrates the variation with temperature of the conductivity of a piezoelectric ceramic and of a ceramic or glass substrate suitable for poling a laminate according to the present invention.

Referring initially to FIG. 3, curve A illustrates the typical electrical resistivity of PZT as a function of temperature. It will be observed that typically the resistivity of this material is about $p = 10^{13}$ ohm-cm at 100 degrees centigrade. A charged piezoelectric transducer has a time constant $ee_Op$ (where e is the relative dielectric constant of the material and $e_O$ is the permittivity of free space). At 100 degrees centigrade and for $e = 2300$, the time constant over which PZT holds a charge is about 0.72 hours. Curve A of FIG. 3 is also typical of many insulating glasses and ceramics in addition to PZT. The resistivity of PZT can be increased by about two orders of magnitude or decreased to about the same degree by appropriate doping. Glasses and ceramics of different resistivity can also be formulated, these materials having resistivity curves generally parallel to that of PZT.

Figure 2A:
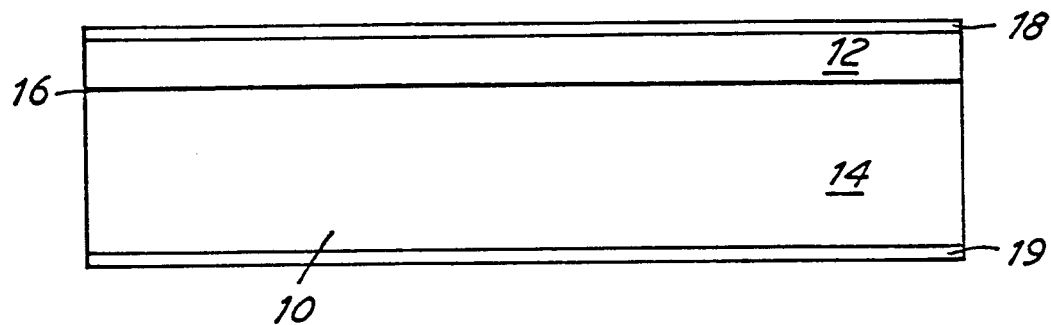
FIG. 2(a) illustrates the laminate of FIG. 1(a) with the application of poling electrodes.

Conventionally, piezoelectric materials are poled by applying metal electrodes to each face of a piezoelectric sheet and applying a poling field there between. A state of saturated poling is achieved in a time short compared with the time constant $ee_Op$ of the PZT sheet. This technique as applied to the laminate component 10 of FIG. 1(a) is illustrated in FIG. 2(a) wherein a pair of electrodes 18 and 19 are applied to the opposite faces of the component. Because the dielectric constant of the piezoelectric sheet 12 is relatively large compared to that of the substrate sheet 14, only a fraction of the applied field is effectively available for poling the piezoelectric layer 12. Consequently, the poling field has to be elevated by a very large factor (e.g. 100) to achieve effective poling, which is frequently not practical. The present invention provides solutions to these problems as described in detail below.

In one form of the invention, the insulating sheet 14 is formed from a ceramic, glass or glass-ceramic characterized by curve B of FIG. 3, which has a resistivity lower, typically by two orders of magnitude, than that of the PZT forming piezoelectric layer 12. This resistivity characteristic may be achieved by appropriately doping insulating sheet 14. The laminate component 10 is then held at a suitable poling temperature and a poling field is applied to electrodes 18 and 19 as illustrated in FIG. 2(a). If, for example, the temperature is 100 degrees centigrade, the time constant for the field to rise to equilibrium by charge leakage through insulating sheet 14 is about $1/100 \times 0.72$ hrs = 20 seconds, assuming that the time constant for the laminate is governed by the dominating dielectric constant of the PZT layer 12 and by the dominating resistivity of the doped insulating layer 14. The field across the PZT layer 12 is now controlled after these rise times by the resistance (or conductance) ratio rather than the dielectric constant ratio of the PZT and substrate sheets 12 and 14, and a field for poling applied between electrodes 18 and 19 not substantially greater than would be required between electrodes on an isolated PZT sheet is adequate for poling.

In other words, by increasing the poling temperature and conductivity of the substrate layer 14, it is arranged that after a relatively short time interval during which the ratio of dielectric constants is of primary importance, the division of the electric field applied across the laminate is governed not by considerations of dielectric constants (which are unfavorable in this regard), but by considerations of resistivity which can be arranged to be favorable by enhancing the conductivity of the substrate layer as described. Under these conditions, maintenance of the poling field for a time period greater than the time constant of the laminate results in a substantial part of the poling voltage being dropped across the piezoelectric layer, thereby allowing the use of a practical poling field. It has been found that increasing the conductivity of the substrate 14 by one or preferably two orders of magnitude relative to the piezoelectric layer 12 has no detrimental effect on the normal operation of laminate 10 or a device constructed therefrom, provided that the reduced time constant remains large compared with the period of the periodic actuation of the device, as will usually be the case. It will also be understood that in this embodiment bond layer 16 may be omitted, it only being essential that a poling potential is created at the boundary between the piezoelectric and substrate layers 12 and 14, which boundary may comprise a region where the latter two layers are mutually diffused.

Suitable dopants to lower the resistivity of a glass, ceramic or glass-ceramic insulating substrate 14 are well known in the art and include Sc, Mg and La ions which introduce oxygen vacancies in the glass lattice. Materials such as Bo and Po can also be used to enrich the metal content of substrate 14. Increasing the temperature at which poling occurs will further reduce the time constant. Thus the time constant for a PZT layer alone at 200 degrees centigrade is typically 1 second with the value for the laminate falling approximately to 1/100 second.

Figure 2B:
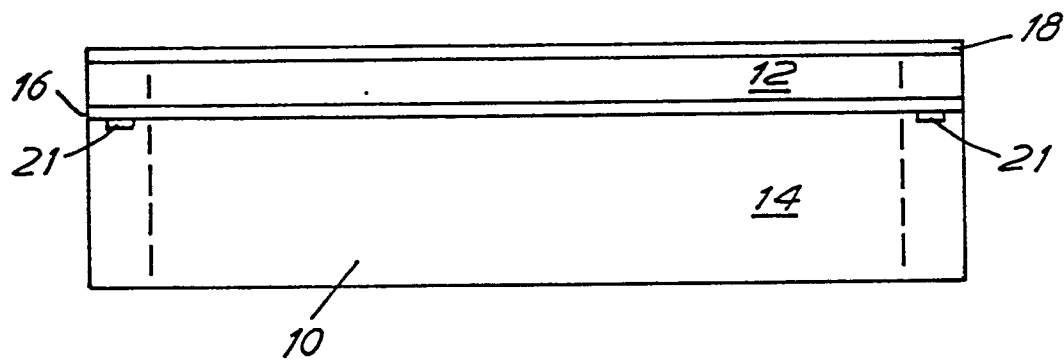
FIG. 2(b) illustrates a piezoelectric laminate constructed according to a second embodiment of the present invention.

An alternative embodiment of the invention is illustrated in FIG. 2(b). Bond layer 16 between piezoelectric and substrate layers 12 and 14 is characterized by an electrical switching property, by which it may be selectively switched between electrically conductive and resistive states. For example, bond layer 16 may comprise a fusible glass layer which is electrically conductive above a given temperature and resistive below the given temperature. Chalcogenide glasses having such characteristics are well known. Glasses having suitable variation in ionic conduction over the temperature range similar in property to glasses of curve B of FIG. 3 may also be suitably used to effect poling, including vanadium oxide and lanthanum oxide glasses or frits.

In this embodiment the control of resistivity with temperature is confined to the bond layer 16 and the insulating base sheet 14 is preferably chosen with higher resistivity comparable with PZT as represented by curve A of FIG. 3. Poling is facilitated by applying one electrode 18 to the external face of the piezoelectric layer 12 with the second electrode being provided by the fusible glass layer in its conductive state. Electrical access to the bond layer 16 may be provided by a conductive track 21 formed along the edge of substrate sheet 14 and disposed between the sheet and bond layer 16. The conductive track will normally be removed by dressing the edges of the laminate component after poling as shown by the dotted lines in FIG. 2(*b*). Heat may be applied to control the temperature and thereby the conductivity of bond layer 16 by any of a number of well known techniques.

In a further implementation of the embodiment of FIG. 2(*b*), the substrate sheet 14 is optically translucent and the fusible glass bond layer 16 is replaced by a fusible glass photoconductor which may be switched to a conductive state by means of an optical beam instead of thermal switching. Optically glass photo-conductors are also well known. Examples include amorphous silicon.

In both of the latter two embodiments, after a time period corresponding to the time constant of the piezoelectric layer 12, substantially the entire poling field is applied across the piezoelectric layer. The poling field is then maintained for a sufficient period of time to properly pole the layer.

It will be understood that numerous changes and modifications in the described embodiments of the invention may be made without departure from its true spirit and scope. The invention therefore is to be limited only as defined in the claims.

What is claimed is:

1. A method of forming a poled laminate including a layer of piezoelectric material and a substrate layer of material which is electrically insulating under normal operating conditions and which is rigidly bonded to said piezoelectric layer, comprising the steps of:

doping said substrate layer to increase the conductivity thereof;

applying a poling voltage to pole the piezoelectric material at a temperature at which the conductivity of the substrate layer is greater than that of the piezoelectric layer by at least an order of magnitude and for a relatively short time interval which causes a substantial part of the applied voltage to be applied across said piezoelectric layer; and maintaining the poling voltage after said interval until said piezoelectric material is effectively poled.

2. A piezoelectric laminate comprising a layer of piezoelectric material, a substrate layer and an intermediate layer to which said piezoelectric and substrate layers are rigidly bonded, said intermediate layer being nonconductive under normal operating conditions, said laminate being formed by:

employing a poling voltage to pole said piezoelectric layer under poling conditions which render said intermediate layer conductive and which upon application of said poling voltage for a relatively short time interval cause a substantial part of the poling voltage to be applied across said piezoelectric layer; and maintaining the poling voltage after said interval until said piezoelectric material is effectively poled.

3. A method of forming a poled laminate including a layer of piezoelectric material, a substrate layer and an intermediate layer to which said piezoelectric and substrate layers are rigidly bonded, said intermediate layer being nonconductive under normal operating conditions, comprising the steps of:

employing a poling voltage to pole said piezoelectric layer under poling conditions which render said intermediate layer conductive and which upon application of said poling voltage for a relatively short time interval cause a substantial part of the poling voltage to be applied across said piezoelectric layer; and maintaining the poling voltage after said interval until said piezoelectric material is effectively poled.

4. The method of claim 1 including the steps of heating said intermediate layer to a temperature at which it is rendered conductive and applying said poling voltage across said intermediate layer and an electrode on the face of said piezoelectric layer remote from said intermediate layer.

5. The method of claim 1 including the steps of optically rendering said intermediate layer conductive and applying said poling voltage across said intermediate layer and an electrode on the face of said piezoelectric layer remote from said intermediate layer.

* * * * *